United States Patent [19]

Otobe et al.

[11] Patent Number: 4,488,109

[45] Date of Patent: Dec. 11, 1984

[54] PHASE DETECTORS FOR DETECTING A MUTUAL PHASE DIFFERENCE BETWEEN TWO SIGNALS

[75] Inventors: Takashi Otobe; Yasutoshi Komatsu; Yoshikazu Murakami, all of Yokohama, Japan

[73] Assignee: Sony Corporation, Tokyo, Japan

[21] Appl. No.: 456,503

[22] Filed: Jan. 7, 1983

[30] Foreign Application Priority Data

Jan. 9, 1982 [JP] Japan ................................. 57-2145

[51] Int. Cl.³ ............................................ G01R 25/00
[52] U.S. Cl. .................................. 324/83 R; 333/218
[58] Field of Search ............ 333/218; 324/58 R, 58 C, 324/83 R, 83 D, 83 A; 307/510; 328/133; 179/2.51, 175.3

[56] References Cited

U.S. PATENT DOCUMENTS 4,230,910 10/1980 Simokat ............................. 179/2.51
4,327,336 4/1982 Cornish ............................. 333/218
4,431,875 2/1984 Simokat ............................. 179/175.3

Primary Examiner—Michael J. Tokar
Attorney, Agent, or Firm—Lewis H. Eslinger; Alvin Sinderbrand

[57] ABSTRACT

A phase detector for detecting a mutual phase difference between two signals, such as first and second microwave signals, comprises first and second signal paths for being supplied with first and second input signals of the same frequency, respectively, and providing with a predetermined additional mutual phase difference between the first and second input signals at their output ends and a field effect transistor having a pair of input electrodes connected to the output ends of the first and second signal paths, respectively, and an output electrode from which an output signal representing a mutual phase difference which the first and second input signals have originally therebetween is derived. The first and second input signals at the input electrodes of the field effect transistor have the original mutual phase difference which is to be detected and the predetermined additional mutual phase difference added by the first and second signal paths therebetween. The field effect transistor is biased to operate with a gate bias voltage nearly equal to a pinch-off voltage thereof. In order to establish such biasing state without reducing the operational gain of the field effect transistor, a biasing resistance connected to the source of the field effect transistor is selected to be low and a current source is provided for supplying an external biasing current to the biasing resistance, thereby to produce the gate bias voltage required.

8 Claims, 12 Drawing Figures

PHASE DETECTORS FOR DETECTING A MUTUAL PHASE DIFFERENCE BETWEEN TWO SIGNALS

BACKGROUND OF THE INVENTION

This invention relates generally to phase detectors suitable for use for detecting a mutual phase difference between two microwave signals, and more particularly, to an improved phase detector comprising a field effect transistor and being able to detect a mutual phase difference between two microwave signals with high sensitivity and superior stability.

For detecting a mutual phase difference between two microwave signals, there has been already proposed a phase detector which is composed of a pair of input signal paths, a quarter wavelength hybrid ring which has four branch signal paths each selected in length substantially to correspond to a quarter of the wavelength of an input signal and interconnected to form a rectangular signal path with a pair of input ends connected to the input signal paths respectively and a pair of output ends, and a pair of diodes connected to the output ends of the quarter wavelength hybrid ring, respectively, in the respective directions opposite to each other. In such a phase detector, first and second microwave signals having a mutual phase difference therebetween are supplied to the input ends of the quarter wavelength hybrid ring through the input signal paths, respectively, and transmitted to the output ends of the quarter wavelength hybrid ring through the rectangular signal path therein. The microwave signals appearing at the output ends of the quarter wavelength hybrid ring are supplied to the diodes connected thereto in the opposite directions, respectively. The diodes detect the supplied microwave signals and cooperate with each other to combine their detected outputs so as to produce an output signal representing the mutual phase difference between the first and second microwave signals supplied to the input signal paths. Thus, the mutual phase difference between the first and second microwave signals is detected.

In the previously proposed phase detector as above mentioned, a portion for detecting substantially a mutual phase difference between two input microwave signals is composed with a pair of diodes as described above. Consequently, with the previously proposed phase detector, it is quite difficult to increase the sensitivity of the phase detecting operation. Further, a reflection characteristic in relation to an input microwave signal at each of the diodes and a temperature characteristic in relation to the DC detected output and an input microwave signal at each of the diodes may vary depending on the power of the input signal. It is also very difficult to make such variations in the characteristics identical between both of the diodes used in a pair, and therefore the previously proposed phase detector tends to be lacking in stability in detecting operation.

OBJECTS AND SUMMARY OF THE INVENTION

Accordingly, it is an object of the present invention to provide an improved phase detector for detecting a mutual phase difference between two signals which avoids the above described problems encountered with the prior art.

Another object of the present invention is to provide an improved phase detector for detecting a mutual phase difference between two microwave signals which performs phase detecting operation with high sensitivity and superior stability.

A further object of the present invention is to provide an improved phase detector for detecting a mutual phase difference between two microwave signals, wherein a reflection characteristic in relation to input microwave signals varies hardly in spite of variations in the power of the input microwave signals.

A still further object of the present invention is to provide an improved phase detector for detecting a mutual phase difference between two microwave signals which comprises a field effect transistor and is formed with simple configuration.

According to an aspect of the present invention, a phase detector for detecting a mutual phase difference between two signals comprises first and second input signal paths for being supplied with two input signals, respectively, and provides a predetermined additional phase difference between these two input signals and a field effect trasistor having two of its input electrodes connected to the first and second input signal paths, respectively, and an output electrode from which an output signal representing the mutual phase difference between the input signals supplied to the first and second input signal paths is derived. The signals supplied to the field effect transistor have the original mutual phase difference which is to be detected and another mutual phase difference added by the first and second input signal paths therebetween. The field effect transistor is biased to operate with such a gate bias voltage as to be nearly equal to its pinch-off voltage. In order to establish such biasing condition without reducing the operational gain of the field effect transistor, a biasing resistor of a low resistance value is connected to the source electrode of the field effect transistor and a biasing circuit is connected to this biasing resistor, thereby to supply an external biasing current to the biasing resistor to produce the required gate bias voltage constantly.

The above, and other objects, features and advantages of the present invention will be apparent in the following detailed description taken in conjunction with accompanying drawings.

DESCRIPTION OF THE PREFERRED EMBODIMENTS

Figure 1:
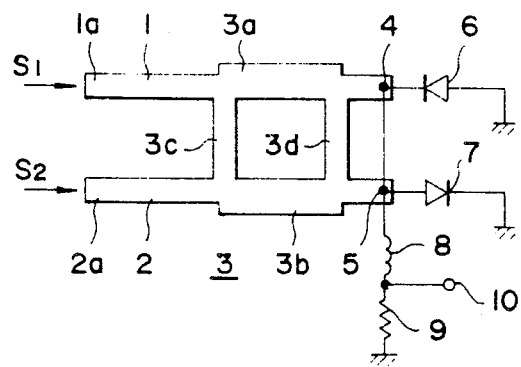
FIG. 1 is a schematic circuit diagram showing a previously proposed phase detector employing a pair of diodes.

First, a previously proposed phase detector for detecting a mutual phase difference between two microwave signals will be explained with reference to FIG. 1. In the previously proposed phase detector illustrated in FIG. 1, a pair of strip lines 1 and 2 having input ends 1a and 2a, respectively, are provided for being supplied with two microwave signals $S_1$ and $S_2$ from their input ends 1a and 2a, respectively. The strip lines 1 and 2 are connected to a pair of input ends of a directional coupler 3 formed into a quarter wavelength hybrid ring and having a pair of output ends 4 and 5. These output ends 4 and 5 are connected to the ground through a pair of diodes 6 and 7 connected thereto in the directions opposite to each other, respectively. The cathode of the diode 6 and the anode of the diode 7 are connected in common to the ground through an inductor 8 provided for being an obstruction against a high frequency signal and a load resistor 9, and an output terminal 10 is derived from the connecting point between the inductor 8 and the load resistor 9.

The microwave signal $S_1$ from the input end 1a of the strip line 1 is transmitted through the strip line 1 and a branch line 3a of the directional coupler 3 which is selected in length substantially to correspond to a quarter of the wavelength of the microwave signal $S_1$ to the output end 4 of the directional coupler 3, and also transmitted through the strip line 1 and branch lines 3c and 3b of the directional coupler 3 which are also selected in length substantially to correspond to a quarter of the wavelength of the microwave signal $S_1$ or through the strip line 1, the branch line 3a and a branch line 3d of the directional coupler 3 which is selected in length substantially to correspond to a quarter of the wavelength of the microwave signal $S_1$ to the output end 5 of the directional coupler 3. The microwave signals appearing at the output ends 4 and 5 respectively in response to the microwave signal $S_1$ have a mutual phase difference of $(\pi/2)$ provided therebetween by the directional coupler 3.

Further, the microwave signal $S_2$ from the input end 2a of the strip line 2 is transmitted through the strip line 2 and the branch line 3d to the output end 5, and also transmitted through the strip line 2 and the branch lines 3c and 3a or through the strip line 2 and the branch lines 3b and 3d to the output end 4, and the microwave signals appearing at the output ends 5 and 4 respectively in response to the microwave signal $S_2$ also have a mutual phase difference of $(\pi/2)$ provided therebetween by the directional coupler 3.

These microwave signals transmitted to the output ends 4 and 5 are detected by the diodes 6 and 7 and the detected outputs of the diodes 6 and 7 are combined to produce an output signal representing a mutual phase difference which the microwave signals $S_1$ and $S_2$ have originally therebetween. The output signal thus obtained is derived from the output terminal 10.

In such detection of a mutual phase difference between two microwave signals by the previously proposed phase detector, however, an output signal representing the mutual phase difference which is to be detected is obtained by means of utilizing detecting operation of a pair of diodes and therefore the aforementioned problems arise therein.

Now, one embodiment of the present invention will be explained with reference to FIGS. 2 to 6 hereinafter.

Figure 2:
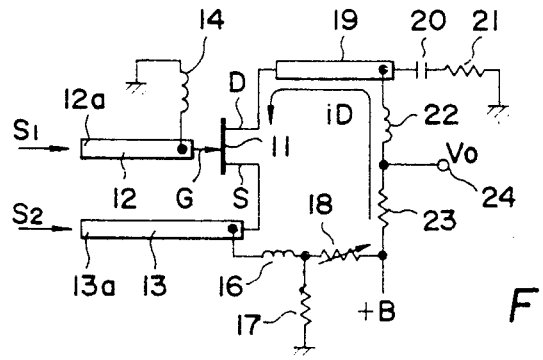
FIG. 2 is a schematic circuit diagram showing one example of a phase detector for detecting a mutual phase difference between two signals according to the present invention.

FIG. 2 shows an example of a phase detector for detecting a mutual phase difference between two signals according to the present invention, to which the microwave signals $S_1$ and $S_2$ mentioned above are supplied as a pair of input signals.

In this example, a single-gate field effect transistor (hereinafter referred to as a FET) 11, such as a Shottky gate FET employing a GaAs semiconductor, is provided and a pair of strip lines 12 and 13 having input ends 12a and 13a, respectively, are connected to a gate G and a source S of the FET 11, respectively. The strip line 12 is grounded for a direct current (DC) through an inductor 14 for being an obstruction against a high frequency signal and the microwave signals $S_1$ and $S_2$ are supplied to the input ends 12a and 13a of the strip lines 12 and 13, respectively. The length of the strip line 12 from its input end 12a to the gate G of the FET 11 and the length of the strip line 13 from its input end 13a to the source S of the FET 11 are so selected that the former is shorter than the latter and the phase shift caused in the microwave signal $S_1$ by the strip line 12 through which the microwave signal $S_1$ is transmitted to the gate G of the FET 11 is different from the phase shift caused in the microwave signal $S_2$ by the strip line 13 through which the microwave signal $S_2$ is transmitted to the source S of the FET 11 by the amount of phase $\theta$ satisfying the following equation;

$$\cos\theta = \frac{1}{2}\left\{ \frac{1}{k} + k - \sqrt{\left(\frac{1}{k} + k\right)^2 + 4} \right\}$$

where k represents a ratio of the amplitude of the microwave signal $S_2$ to the amplitude of the microwave signal $S_1$.

The source S of the FET 11 is connected to the ground through an inductor 16 provided for being an obstruction against a high frequency signal and a biasing resistor 17. Between one end of the biasing resistor 17 and a voltage source +B, a variable resistor 18 is connected to supply a biasing current to the biasing resistor 17.

Further, a drain D of the FET 11 is connected to one end of a strip line 19. The other end of the strip line 19 is connected through a capacitor 20 provided for being an obstruction against a direct current to a terminal resistor 21 so that the strip line 19 is terminated at the other end thereof with a matching impedance for a high frequency signal to avoid the reflection of the high frequency signal thereat. The strip line 19 is also connected to the voltage source +B through an inductor 22 provided for being an obstruction against a high frequency signal and a load resistor 23, and an output terminal 24 is derived from the connecting point between the inductor 22 and the load resister 23.

Figure 3:
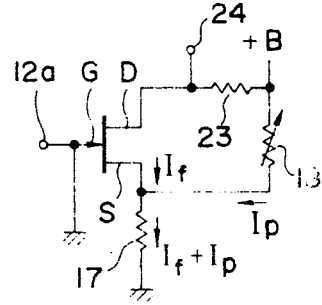
FIG. 3 is a diagram showing an equivalent circuit for a direct current of the example shown in FIG. 2.

An equivalent circuit for a direct current (DC) of the above described phase detector shown in FIG. 2 can be illustrated as shown in FIG. 3. In the circuit of FIG. 3, the FET 11 is biased by the voltage produced across the biasing resistor 17 through which the biasing current flows so that the potential at the gate G becomes lower than the potential at the source S and operates with a gate bias voltage nearly equal to its pinch-off voltage. A drain current of the FET 11 varies in response to variations in both microwave signals supplied to the gate G and the source S, respectively, and an output is obtained from variations in the voltage apearing across the load resistor 23 in response to the variations in the drain current and derived to the output terminal 24. In this case, for the purpose of increasing the ratio of the voltage variations obtained across the load resistor 23 to the variations in the microwave signals supplied to the gate G and source S, that is, for the purpose of increasing the sensitivity of the circuit, the biasing resistor 17 connected to the source S is selected to have a very low resistance value. However, in case that the resistance value of the biasing resistor 17 is so low, since a source current $I_f$ flowing out from the source S of the FET 11 which is biased to operate with the gate bias voltage nearly equal to the pinch-off voltage is very small, the voltage necessary for biasing the FET 11 to provide with the required gate bias voltage could not be obtained across the biasing resistor 17 by only the flow of the source current $I_f$. Accordingly, an additional biasing current $I_p$ is caused to flow into the biasing resistor 17 from the voltage source +B through the variable resistor 18 and therefore the voltage necessary for biasing the FET 11 to provide with the required gate bias voltage is obtained by the flow of the sum $I_f + I_p$ of the source current $I_f$ and the additional biasing current $I_p$. The value of the additional biasing current $I_p$ is adjusted by the variable resistor 18 to be, for example, more than ten times of the value of the source current $I_f$. Thus, both intentions for increasing the sensitivity of the circuit by means of employing the biasing resistor of the low resistance value and for obtaining the voltage necessary for biasing the FET 11 to provide with the required gate biasing voltage across the biasing resistor 17 are achieved.

Figure 4:
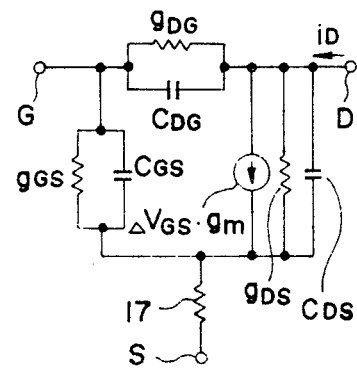
FIG. 4 is a diagram showing an equivalent circuit for a high frequency signal of a field effect transistor employed in the example shown in FIG. 2.

Next, an equivalent circuit for a high frequency signal of the FET 11 can be illustrated as shown in FIG. 4. In the circuit of FIG. 4, $g_{DG}$ and $C_{DG}$ stand for the conductance and capacitance between the drain D and gate G, respectively, $g_{GS}$ and $C_{GS}$ stand for the conductance and capacitance between the gate G and source S, respectively, $g_{DS}$ and $C_{DS}$ stand for the conductance and capacitance between the drain D and source S, respectively, $\Delta V_{GS}$ stands for the variation in a gate-source voltage $V_{GS}$ between the gate G and source S, $g_m$ stands for the transfer conductance and $i_D$ stands for the drain current.

Although the drain current $i_D$ is to vary in response to variations in not only the gate bias voltage but also a drain bias voltage, the variations in the drain current $i_D$ caused in response to the variations in the drain bias voltage can be neglected in the practical operation state because the drain bias voltage is selected to be sufficiently high so that the FET 11 operates in the saturation region in its operation mode. Besides, the transfer conductance $g_m$ is expressed in the form containing a term of the first degree to a term of infinitely high degree as follows;

$$g_{m1} = \frac{\partial i_D}{\partial V_{GS}}, \quad g_{m2} = \frac{\partial^2 i_D}{\partial V_{GS}^2}, \quad g_{m3} = \frac{\partial^3 i_D}{\partial V_{GS}^3} \ldots$$

$$g_{mn} = \frac{\partial^n i_D}{\partial V_{GS}^n}$$

With the transfer conductance $g_m$ expressed in the form in which the terms of higher than the sixth degree are eliminated as being negligible, an average value $\overline{\Delta i_D}$ of variations $\Delta i_D$ in the drain current $i_D$ depending on the variations $\Delta V_{GS}$ in the gate-source voltage $V_{GS}$ which are caused by voltage variations in the microwave signals supplied to the gate G and source S, respectively, is expressed in the following equation;

$$\overline{\Delta i_D} = \alpha \cdot \overline{(g_{m1} \cdot \Delta V_{GS} + \frac{1}{2} \cdot g_{m2} \cdot \Delta V_{GS}^2 +} \quad (1)$$

$$\overline{\frac{1}{6} \cdot g_{m3} \cdot \Delta V_{GS}^3 + \frac{1}{24} \cdot g_{m4} \cdot \Delta V_{GS}^4 +}$$

$$\overline{\frac{1}{120} \cdot g_{m5} \cdot \Delta V_{GS}^5)}$$

where $\alpha$ is a constant.

Assuming that there is a phase difference $\theta'$ between the phase of the microwave signal ($S_1'$) supplied to the gate G and the phase of the microwave signal ($S_2'$) supplied to the source S and the microwave signals $S_1$ and $S_2$ have voltage values $V_G$ and $V_S$ expressed as follows, respectively;

$$V_G = a \cdot \cos \omega t, \quad V_S = b \cdot \cos (\omega t + \theta'),$$

the following equation is obtained;

$$\Delta V_{GS} = V_G - V_S = a \cdot \cos \omega t - b \cdot \cos (\omega t + \theta') \quad (2)$$

Figure 5:
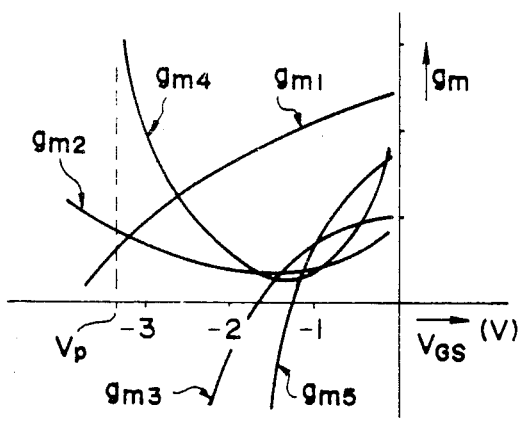
FIGS. 5 and 6 are graphic illustrations used for explaining the operation of the example shown in FIG. 2.

The value of each of the terms $g_{m1}$ to $g_{m5}$ of the transfer conductance $g_m$ is obtained in calculation as shown in FIG. 5, where the abscissa indicates the gate-source voltage $V_{GS}$, in case that the pinch-off voltage ($V_p$) of the FET 11 is 3.3 volt.

Now, substituting the right member of the equation (2) for $\Delta V_{GS}$ in the equation (1), the following equation is obtained;

$$\overline{\Delta i_D} \approx \alpha \cdot g_{m4} \cdot \overline{\{a \cdot \cos \omega t - b \cdot \cos(\omega t + \theta')\}^4} \quad (3)$$

In calculating to this equation (3), the first, third and fifth terms in the right member of the equation (1) are eliminated because the average of each of them becomes zero and the second term in the right member of the equation (1) is also eliminated because the FET 11 operates with the gate bias voltage nearly equal to the pinch-off voltage $V_p$ and, as shown in FIG. 5, $g_{m2}$ is much less that $g_{m4}$ when the gate-source voltage $V_{GS}$ is nearly equal to the pinch-off voltage $V_p$.

Developing the right member of the equation (3), the terms concerning high frequency components are eliminated because the average of each of them becomes zero and consequently the following equation is obtained;

$$\overline{\Delta i_D} \approx \alpha \cdot g_{m4} \cdot \left\{ \frac{3}{8}(a^4 + b^4) + \frac{3}{2} a^2 b^2 - \right. \tag{4}$$

$$\left. \frac{3}{2} ab(a^2 + b^2) \cos \theta' + \frac{3}{4} a^2 b^2 \cos 2\theta' \right\}.$$

Since the ratio of the amplitude of the microwave signal $S_2$ to the amplitude of the microwave signal $S_1$ is represented by k, $k=(b/a)$ is satisfied. Accordingly, the equation (4) can be rearranged to the following equation;

$$\overline{\Delta i_D} = \alpha \cdot g_{m4} \cdot \frac{a^4}{8} \cdot \left[ 12k^2 \left\{ \cos \theta' - \frac{1}{2}\left(k + \frac{1}{k}\right) \right\}^2 + \right. \tag{5}$$

$$\left. 3(1 + k^4) + 6k^2 - 3(1 + k^2)^2 \right]$$

Assuming that the following equation is satisfied;

$$A = 12k^2 \cdot \left\{ \cos \theta' - \frac{1}{2}\left(k + \frac{1}{k}\right) \right\}^2 + 3(1 + k^4) + \tag{6}$$

$$6k^2 - 3(1 + k^2)^2$$

when $k<0$, $\frac{1}{2}(k+(1/k)) \geqq 1$ is satisified and A increases monotonously in response to variations of $\cos \theta'$, so that A takes a maximum value Amax when $\cos \theta' = -1$ and a minimum value Amin when $\cos \theta' = 1$. Accordingly, Amax and Amin are obtained as expressed in the following equations, respectively;

$$A\max = 12k^2 + 12k(1+k^2) + 3(1+k^4) + 6k^2$$

$$A\min = 12k^2 - 12k(1+k^2) + 3(1+k^4) + 6k^2$$

and an average value Aave of A is expressed in the following equation;

$$Aave = \frac{A\max + A\min}{2} = 12k^2 + 3(1 + k^4) + 6k^2 \tag{7}$$

Assuming that the equation: $\theta' = \theta_0' + \Delta\theta'$, where $\theta_0'$ is a fixed phase difference and $\Delta\theta'$ is a variable phase difference, that is, a phase difference to be detected, is satisfied and a value of $\theta'$ by which the right member of the equation (6) takes the average value Aave expressed in the equation (7) is employed as the above mentioned $\theta_0'$, $\Delta\theta'$ becomes zero in this case and accordingly A becomes an odd function of $\Delta\theta'$. Further, according to the equations (5) and (6), the equation:

$$\overline{\Delta i_D} = \alpha \cdot g_{m4} \cdot \frac{a^4}{8} \cdot A$$

is satisfied. As a result of this, it is apparent that $\overline{\Delta i_D}$ is also an odd function of $\Delta\theta'$ and varies in response to positive and negative variations of $\Delta\theta'$.

Accordingly, in the equation (6), substituting Aave for A in the left member and $\theta_0'$ for $\theta'$ in the right member, the following equation is obtained;

$$\cos \theta_0' = \frac{1}{2}\left\{ \frac{1}{k} + k \pm \sqrt{\left(\frac{1}{k} + k\right)^2 + 4} \right\} \tag{8}$$

Since $|\cos \theta_0'|$ is less than or equal to 1, $\cos \theta_0'$ should be expressed in the following equation;

$$\cos \theta_0' = \frac{1}{2}\left\{ \frac{1}{k} + k - \sqrt{\left(\frac{1}{k} + k\right)^2 + 4} \right\}. \tag{9}$$

In accordance with the above description, it is understood that when there is the fixed phase difference $\theta_0'$ satisfying the equation (9) between the microwave signal $S_1'$ supplied to the gate G and the microwave signal $S_2'$ supplied to the source S, the average value $\overline{\Delta i_D}$ of the variations $\overline{\Delta i_D}$ in the drain current $i_D$ varies in response to the variations of the variable phase difference $\Delta\theta'$ between the microwave signals $S_1'$ and $S_2'$ and therefore the variable phase difference $\Delta\theta'$ can be detected on the strength of the average value $\overline{\Delta i_D}$.

In the circuit of FIG. 2, the strip lines 12 and 13 are so selected that the microwave signal $S_1$ transmitted to the gate G of the FET 11 through the strip line 12 and the microwave signal $S_2$ transmitted to the source S of the FET 11 through the strip line 13 have therebetween the additional mutual phase difference $\theta$ satisfying the equation:

$$\cos \theta = \frac{1}{2}\left\{ \frac{1}{k} + k - \sqrt{\left(\frac{1}{k} + k\right)^2 + 4} \right\},$$

as described above. That is, when the microwave signals $S_1$ and $S_2$ are supplied to the gate G and source S as the microwave signals $S_1'$ and $S_2'$, respectively, the microwave signals $S_1'$ and $S_2'$ have therebetween the mutual phase difference which the microwave signals $S_1$ and $S_2$ have originally therebetween as a variable phase difference and the additional phase difference $\theta$ which is added by the strip lines 12 and 13 as a fixed phase difference. This fixed phase difference $\theta$ is identical with the fixed phase different $\theta_0'$ satisfying the above mentioned equation (9) and consequently the average value $\overline{\Delta i_D}$ of the variations $\Delta i_D$ of the drain current $i_D$ of the FET 11 in the circuit shown in FIG. 2 varies in response to the variations in the variable phase difference between the microwave signals $S_1'$ and $S_2'$, that is, the variations in the phase difference between the microwave signals $S_1$ and $S_2$. This average value $\overline{\Delta i_D}$ causes variations in the voltage across the load resistor 23 and an output signal $V_o$ obtained at the output terminal 24 is varied in response to the voltage variations across the load resistor 23. Accordingly, the mutual phase difference between the microwave signals $S_1$ and $S_2$ is detected in the form of the output signal $V_o$.

According to the above description, it is apparent that the circuit of FIG. 2 is operative as a phase detector for detecting the mutual phase difference between the microwave signals $S_1$ and $S_2$ supplied to the input ends 12a and 13a, respectively.

In the case of this circuit of FIG. 2, the ratio of the variations in the output signal $V_o$ to the variations in the phase difference between the microwave signals $S_1$ and $S_2$ is increased owing to the low resistance value of the biasing resistor 17 connected to the source S of the FET 11 and therefore high sensitivity for phase detection can be obtained. Further, since the phase detection is substantially achieved at one FET, that is, the FET 11, operation for the phase detection can be performed very stably.

Incidentally, since the right member of the equation (9) always takes an negative value, the fixed phase difference $\theta_0'$ is to be more than 90 degrees and less than 270 degrees. Accordingly, a difference between the length of the strip line 12 and the length of the strip line 13 is selected to be longer than $\frac{1}{4}\cdot\lambda$ and shorter than $\frac{3}{4}\cdot\lambda$ ($\lambda$ is a transfer wavelength).

Figure 6:
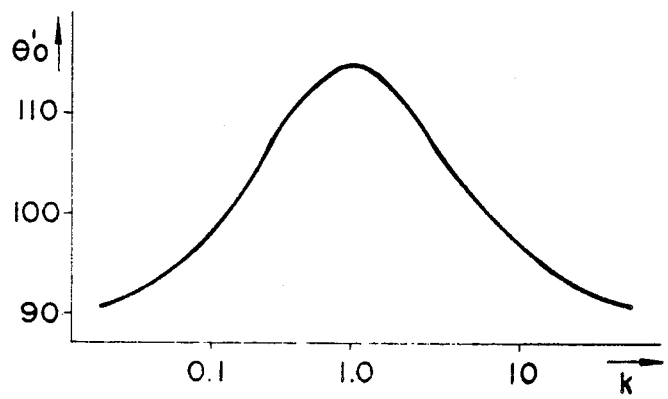

Further, the relation between the fixed phase difference $\theta_0'$ and the ratio k is shown in FIG. 6. The fixed phase difference $\theta_0'$ takes a value in the range of about 110 to about 115 when the ratio k takes a value in the range of 0.5 to 2, that is, when the amplitude of one of the microwave signals $S_1$ and $S_2$ is equal to or more than a half of the amplitude of the other of the microwave signals $S_1$ and $S_2$. In practice, it is usual that the fixed phase difference $\theta_0'$ is arranged to take such a value in the range of about 110 to about 115.

Figure 7:
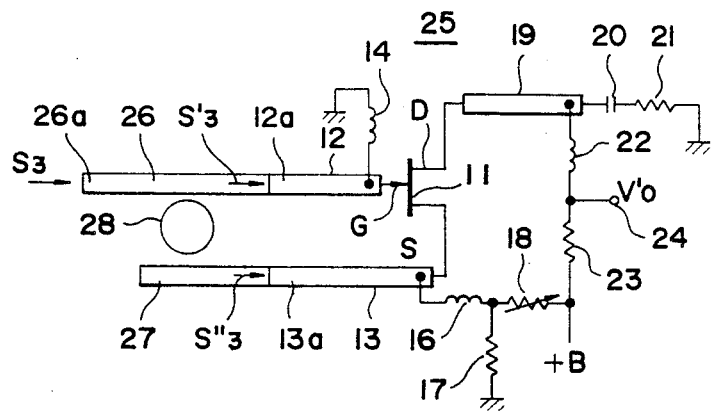
FIG. 7 is a schematic circuit diagram showing a frequency discriminator employing the example shown in FIG. 2.

FIG. 7 shows a frequency discriminator to which the phase detector according to the present invention and shown in FIG. 2 is applied. In the circuit shown in FIG. 7, the phase detector 25 is shown with the references common to FIG. 2 and another pair of strip lines 26 and 27 are connected to the input ends 12a and 13a of the phase detector 25, respectively. Further, a dielectric resonator 28 having a resonant frequency $f_o$ (for example, 11.66 GHz) is provided between the strip lines 26 and 27 so as to couple electrically with both of them. At one end of the strip line 26 an input end 26a is provided and a microwave signal $S_3$ having a frequency $f_s$ which is, for example, centered at 11.66 GHz and variable to deviate by about 10 MHz from 11.66 GHz is supplied therefrom. A transfer wavelength $\lambda_g$ of the phase detector 25 is selected to be identical with the wavelength of a microwave signal having the frequency $f_o$.

The microwave signal $S_3$ supplied to the input end 26a of the strip line 26 is transmitted to the input end 12a of the phase detector 25 through the strip line 26 and also to the input end 13a of the phase detector 25 through a portion of the strip line 26, the dielectric resonator 28 and the strip line 27 because the electrical coupling between the strip line 26 and the dielectric resonator 28 and between the dielectric resonator 28 and the strip line 27 allows the microwave signal $S_3$ to be transmitted to the strip line 27 from the strip line 26. In this case, assuming that $S'_3$ stands for the microwave signal at the input end 12a and $S''_3$ stands for the microwave signal at the input end 13a, the phase of the microwave signal $S'_3$ is shifted by the amount of phase depending on the frequency $f_s$ from a reference phase which the microwave signal $S'_3$ could have if the dielectric resonator 28 were not provided in a first phase direction and the phase of the microwave signal $S''_3$ is also shifted by the amount of phase depending on the frequency $f_s$ from the above mentioned reference phase in a second phase direction opposite to the first phase direction.

Such phase shift in each of the microwave signals $S'_3$ and $S''_3$ will be explained in more detail with reference to FIG. 8 hereinafter.

The phase of the microwave signal $S'_3$ having the frequency $f_s$ is made identical with the above mentioned reference phase when the frequency $f_s$ is equal to the frequency $f_o$, delayed compared with the reference phase when the frequency $f_s$ is lower than the frequency $f_o$ and advanced compared with the reference phase when the frequency $f_s$ is higher than the frequency $f_o$. This phase shift in the microwave signal $S'_3$ is caused within the phase range of $-(\pi/2)$ to $+(\pi/2)$ in relation to the reference phase and the amount of phase shifted is determined depending on a difference between the frequency $f_s$ and the frequency $f_o$. The relation between the amount of phase $\phi$ shifted from the reference phase and the frequency $f_s$ for the microwave signal $S'_3$ is shown with a broken line in FIG. 8.

On the other hand, the phase of the microwave signal $S''_3$ also having the frequency $f_s$ is made identical with the reference phase when the frequency $f_s$ is equal to the frequency $f_o$, advanced compared with the reference phase when the frequency $f_s$ is lower than the frequency $f_o$ and delayed compared with the reference frequency when the frequency $f_s$ is higher than the frequency $f_o$. This phase shift in the microwave signal $S''_3$ is also caused within the phase range of $-(\pi/2)$ to $+(\pi/2)$ in relation to the reference phase and the amount of phase shifted is also determined depending on the difference between the frequency $f_s$ and the frequency $f_o$. The relation between the amount of phase $\phi$ shifted from the reference phase and the frequency $f_s$ for the microwave signal $S''_3$ is shown with a solid line in FIG. 8.

Figure 8:
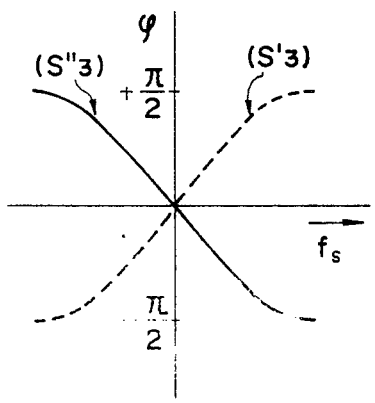
FIG. 8 is a graphic illustration used for explaining the frequency discriminator shown in FIG. 7.

As apparent from the above description and FIG. 8, the microwave signals $S'_3$ and $S''_3$ have a mutual phase difference which depends on the frequency $f_s$ therebetween. Assuming that this mutual phase difference between the microwave signals $S'_3$ and $S''_3$ is referred to as $\theta_3'$, the mutual phase difference $\theta_3'$ is zero when the frequency $f_s$ is equal to the frequency $f_o$.

Accordingly, in the circuit of FIG. 7, the microwave signals $S'_3$ and $S''_3$ having the mutual phase difference $\theta_3'$ which varies in response to variations in the frequency $f_s$ of the microwave signal $S_3$ are supplied to the input ends 12a and 13a of the phase detector 25, respectively, and therefore an output signal $V'_o$ representing the mutual phase difference $\theta_3'$ is obtained at the output terminal 24 through such operation of the phase detector 25 as explained with reference to the circuit of FIG. 2. The output signal $V'_o$ varies in response to variations in the mutual phase difference $\theta_3'$, that is, in response to variations in the frequency $f_3$ of the microwave signal $S_3$, and this means that the circuit of FIG. 7 is operative as a frequency discriminator for producing an output depending on the frequency of an input signal.

As for the circuits shown in FIGS. 2 and 7, it is possible to substitute a transistor having emitter, collector and base electrodes for the variable resistor 18. In such a case, the emitter and collector electrodes of the transistor are connected to one end of the biasing resistor 17 coupled with the source S of the FET 11 and the voltage source $+B$, respectively, and the base of the transistor is supplied with a predetermined bias voltage, so that the potential at the source S of the FET 11 is determined by the potential at the base of the transistor so as to hardly vary in response to variations in the source current on the FET 11. This results in that the resistant value of the biasing resistor 17 is equivalently reduced and consequently the sensitivity of the circuit is further increased.

In addition, it is possible in the above case to achieve the temperature compensation for the output signal obtained at the output terminal 24 by means of controlling the potential at the base electrode of the transistor in response to temperature variations.

Figure 9:
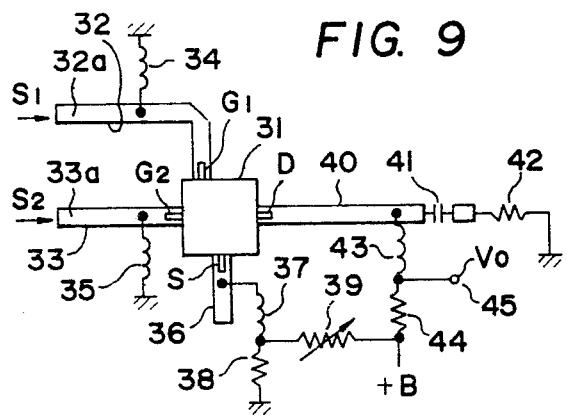
FIG. 9 is a schematic circuit diagram showing another example of a phase detector for detecting a mutual phase difference between two signals according to the present invention.

FIG. 9 shows another example of the phase detector according to the present invention, to which the microwave signals $S_1$ and $S_2$ mentioned above are supplied in the same manner as the example of FIG. 2.

In this example, a dual-gate field effect transistor (hereinafter referred to as a DG FET) 31 having first and second gates $G_1$ and $G_2$, a source S and a drain D is provided and a pair of strip lines 32 and 33 having input ends 32a and 33a, respectively, are connected to the first and second gates $G_1$ and $G_2$ of the DG FET 31, respectively. The strip lines 32 and 33 are grounded for a direct current (DC) through inductors 34 and 35 provided for being obstructions against a high frequency signal, respectively, and the microwave signals $S_1$ and $S_2$ are supplied to the input ends 32a and 33a of the strip lines 32 and 33, respectively. The length of the strip line 32 from the input end 32a to the first gate $G_1$ and the length of the strip line 33 from the input end 33a to the second gate $G_2$ are so selected that the former is longer by an odd multiple of a quarter of a transfer wavelength $\lambda_g'$ than the latter and consequently the phase shift caused in the microwave signal $S_1$ by the strip line 32 through which the microwave signal $S_1$ is transmitted to the first gate $G_1$ is different by an odd multiple of $(\pi/2)$ from the phase shift caused in the microwave signal $S_2$ by the strip line 33 through which the microwave signal $S_2$ is transmitted to the second gate $G_2$.

Another strip line 36 having the length corresponding to an odd multiple of a quarter of the transfer wavelength $\lambda_g'$ is connected to the source S of the DG FET 31. One end of the strip line 36 is opened so that the source S of the DG FET 31 is grounded for a high frequency signal of the same wavelength as the transfer wavelength $\lambda_g'$. The strip line 36 is also connected through an inductor 37 provided for being an obstruction against a high frequency signal and a biasing resistor 38 to the ground. Between one end of the biasing resistor 38 and a voltage source +B having a voltage value $V_B$, a variable resistor 39 is connected.

Further, the drain D of the DG FET 31 is connected to one end of further strip line 40. The other end of the strip line 40 is connected through a capacitor 41 provided for being an obstruction against a direct current to a terminal resistor 42 so that the strip line 40 is terminated at the other end thereof with a matching impedance for a high frequency signal to avoid the reflection of the high frequency signal thereat. The strip line 40 is also connected to the voltage source +B through an inductor 43 and a load resistor 44 having a resistant value r, and an output terminal 45 is derived from the connecting point between the inductor 43 and the load resistor 44.

Figure 10:
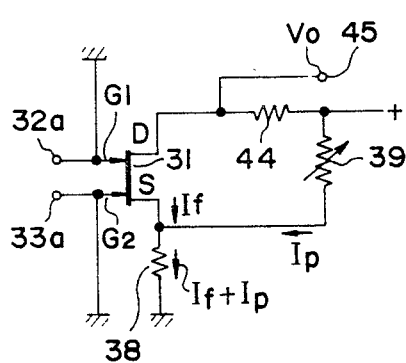
FIG. 10 is a diagram showing an equivalent circuit for a direct current of the example shown in FIG. 9.

An equivalent circuit for a direct current (DC) of the phase detector shown in FIG. 9 can be illustrated as shown in FIG. 10. In the circuit of FIG. 10, the DG FET 31 is biased by the voltage produced across the biasing resistor 38 through which a source current $I_f$ and an additional biasing current $I_p$ from the variable resistor 39 flow so that the potentials at the first and second gates $G_1$ and $G_2$ become lower that the potential at the source S and operates with a gate bias voltage nearly equal to its pinch-off voltage. A drain current of the DG FET 31 varies in response to variations in both microwave signals supplied to the first and second gates $G_1$ and $G_2$, respectively, and an output is obtained from variations in the voltage appearing across the load resistor 44 in response to the variations in the drain current and derived to the output terminal 45.

The resistance value of the biasing resistor 38 is selected to be low in the same manner as the biasing resistor 17 in the circuit of FIG. 2 for the purpose of increasing the sensitivity of the circuit and further the variable resistor 39 is provided for the same purpose as the variable resistor 18 in the circuit of FIG. 2.

Figure 11A:
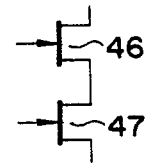
FIG. 11A is a diagram showing an equivalent circuit of a dual-gate field effect transistor employed in the example shown in FIG. 10.
Figure 11B:
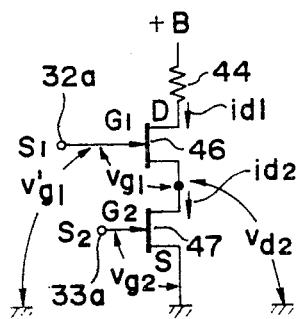
FIG. 11B is a equivalent circuit diagram used for explaining the operation of the example shown in FIG. 9.

The DG FET 31 is equivalent to a serial connection of a pair of FETs in which the source of one of them is connected to the drain of the other of them, such as the serial connection of a pair of FETs 46 and 47 as shown in FIG. 11A. With such an equivalent of the DG FET 31, an equivalent circuit for a high frequency signal of the phase detector shown in FIG. 9 can be illustrated as shown in FIG. 11B. In the equivalent circuit shown in FIG. 11B, the gate of the FET 46 and the gate of the FET 47 correspond to the first and second gates $G_1$ and $G_2$ of the DG FET 31, respectively, and the drain of the FET 46 and the source of the FET 47 correspond to the drain D and the source S of the DG FET 31, respectively.

In the circuit of FIG. 11B, $v_{g1}$ stands for the gate-source voltage of the FET 46, $v_{g2}$ stands for the gate-source voltage of the FET 47, $v'_{g1}$ stands for the gate-ground voltage of the FET 46, $v_{d2}$ stands for the drain-source voltage of the FET 47, $i_{d1}$ stands for the drain current of the FET 46 and $i_{d2}$ stands for the drain current of the FET 47.

Since the DG FET 31 is biased to operate with the gate bias voltage nearly equal to the pinch-off voltage as mentioned above, each of the FETs 46 and 47 is to be also biased to operate with the gate bias voltage nearly equal to its pinch-off voltage.

In general, when a FET operates with such a gate bias voltage supplied thereto as to be nearly equal to its pinch-off voltage $V_p$, a gate-source voltage $v_g$ and a drain current $i_d$ therein satisfy the following equation;

$$i_d = I(V_p - K \cdot v_g)^2,$$

where I and K are constants.

Accordingly, as for the FET 46 in the circuit of FIG. 11B, the following equation is obtained;

$$i_{d1} = I(V_{p1} - K_1 \cdot v_{g1})^2 = I\{V_{p1} - K_1 \cdot (v'_{g1} - v_{d2})\}^2 \quad (10)$$

where $V_{p1}$ is the pinch-off voltage of the FET 46 and $K_1$ is a constant.

$v_{d2}$ is a function of $v_{g2}$ and the following equation is obtained as a reasonable approximation;

$$v_{d2} = R \cdot v_{g2} \quad (11).$$

where R is a constant.

From the equations (10) and (11), the following equation is obtained;

$$\begin{aligned}i_{d1} &= I\{V_{p1} - K_1(v'_{g1} - R \cdot v_{g2})\}^2 \quad (12)\\ &= I\{V_{p1}^2 - 2V_{p1} \cdot K_1(v'_{g1} - R \cdot v_{g2}) +\\ &\quad K_1^2 \cdot v'^2_{g1} - 2R \cdot K_1 \cdot v'_{g1} \cdot v_{g2} + K_1^2 \cdot R^2 \cdot v_{g2}^2\}\end{aligned}$$

$v'_{g1}$ and $v_{g2}$ correspond to the voltage values of the microwave signals $S_1$ and $S_2$ at the first and second gates $G_1$ and $G_2$, respectively, and assuming that there is a mutual phase difference $\gamma$ between the microwave signal $S_1$ at the input end 32a and the microwave signal $S_2$ at the input end 33a, and the microwave signal $S_1$ at the input end 32a and the microwave signal $S_2$ at the input end 33a have voltage values cos $(\omega t + \gamma)$ and cos $\omega t$, respectively, since the microwave signal $S_1$ at the first gate $G_1$ and the microwave signal $S_2$ at the second gate $G_2$ have therebetween an additional phase difference of an odd multiple of $(\pi/2)$, which is provided by the strip lines 32 and 33, as explained above, $v'_{g1}$ and $v_{g2}$ are expressed as follows, respectively;

$$v'_{g1} = \cos\left( \omega t + \gamma + \frac{\pi}{2} \cdot (2n + 1) \right) \quad (n \text{ is zero or a positive integer}) \quad (13)$$

$$= \cos(\omega t + \phi), \text{ where } \phi = \gamma + \frac{\pi}{2}(2n + 1)$$

$$v_{g2} = \cos \omega t. \quad (14)$$

Substituting the right member of the equation (13) for $v'_{g1}$ in the equation (12) and also the right member of the equation (14) for $v_{g2}$ in the equation (12) to rearrange the equation (12), an average value $\overline{i_{d1}}$ of the drain current $i_{d1}$ of the FET 46 is obtained from the rearranged equation (12) as shown in the following equation;

$$\overline{i_{d1}} = I[V_{p1}^2 - R \cdot K_1 \cdot [\cos(2\omega t + \phi) + \cos \phi]]$$

In solving this equation, the terms concerning high frequency components are eliminated because the average of each of them becomes zero.

Further, the average of cos $(2\omega t + \phi)$ becomes zero and therefore the following equation is obtained;

$$\overline{i_{d1}} = I(V_{p1}^2 - R \cdot K_1 \cdot \cos \phi) \quad (15)$$

$$= I(V_{p1}^2 \pm R \cdot K_1 \cdot \sin \gamma)$$

As apparent from the equation (15), the average value $\overline{i_{d1}}$ of the drain current of the FET 46 is an odd function of the mutual phase difference $\gamma$ between the microwave signals $S_1$ and $S_2$.

An output signal $V_o'$ obtained at the output terminal 45 of the circuit shown in FIGS. 9 and 10 is obtained by subtracting the voltage value across the load resistor 44 from the voltage value $V_B$ of the voltage source $+B$ and the voltage value across the load resistor 44 is obtained as a product of the resistant value r of the load resistor 44 and the current value of the drain current of the DG FET 31, that is, the average value $\overline{i_{d1}}$ of the drain current $i_{d1}$ of the FET 46. Accordingly, the following equation is obtained;

$$V_o' = V_B - \overline{i_{d1}} \cdot r$$

$$= (V_B - r \cdot I \cdot V_{p1}^2) \pm I \cdot R \cdot r \cdot K_1 \cdot \sin \gamma$$

As apparent from the above final equation, the output signal $V_o'$ obtained at the output terminal 45 is an odd function of the mutual phase difference $\gamma$ between the microwave signals $S_1$ and $S_2$, that is, the output signal $V_o'$ is a direct current (DC) voltage varying in response to variations in the mutual phase difference $\gamma$ between the microwave signals $S_1$ and $S_2$.

According to the above, it is apparent that the circuit of FIG. 9 is operative as a phase detector for detecting the mutual phase difference between the microwave signals $S_1$ and $S_2$ supplied to the input ends 32a and 33a, respectively.

In the case of the circuit of FIG. 9, high sensitivity for phase detection can be obtained owing to the low resistant value of the biasing resistor 38 in the same manner as the circuit of FIG. 2. Besides, in practice, the first and second gates $G_1$ and $G_2$ of the DG FET 31, to which the microwave signals $S_1$ and $S_2$ are supplied to have their mutual phase difference detected, are formed at positions very close to each other on a semiconductor substrate so that little difference in various characteristics between both gates $S_1$ and $S_2$ is found and therefore, in this case, phase detecting operation with superior stability can be performed.

What is claimed is:

1. A phase detector for detecting a mutual phase difference between two signals comprising:
   first and second input terminals being supplied with first and second input signals, respectively, a field effect transistor having at least one gate electrode, a source electrode and a drain electrode, two of the electrodes of said field effect transistor being used as first and second input electrodes, respectively,
   a first signal path provided between said first input terminal and said first input electrode of the field effect transistor for transmitting said first input signal to said first electrode of the field effect transistor, said first signal path being so selected to impart a first phase shift to said first input signal transmitted therethrough to said first input electrode of the field effect transistor, a second signal path provided between said second input terminal and said second input electrode of the field effect transistor for transmitting said second input signal to said second electrode of the field effect transistor, said second signal path being so selected to impart a second phase shift to said second input signal transmitted therethrough to said second electrode of the field effect transistor, said second phase shift being different by a predetermined amount of phase from said first phase shift,
   a biasing resistor connected to the source electrode of said field effect transistor,
   a current source for supplying a biasing current to said biasing resistor, and
   a load circuit connected to the drain electrode of said field effect transistor for deriving an output signal representing the mutual phase difference between said first and second input signals.

2. A phase detector according to claim 1, wherein said field effect transistor is provided between the gate and source electrodes thereof with a gate bias voltage which is nearly equal to the pinch-off voltage of said field effect transistor.

3. A phase detector according to claim 1, where said first and second input signals are two microwave signals of the same frequency, and said first and second signal paths are formed by a pair of strip lines different in length from each other.

4. A phase detector according to claim 1, wherein said field effect transistor has a pair of gate electrodes used as said first and second input electrodes, and said second phase shift caused in said second input signal is different by an odd multiple of ($\pi/2$) from said first phase shift caused in said first input signal.

5. A phase detector according to claim 4, wherein said first and second input signals are two microwave signals of the same frequency, and said first and second signal paths are formed by first and second strip lines, respectively, the length of said first strip line being different by an odd multiple of a quarter of a transfer wavelength from the length of said second strip line.

6. A phase detector according to claim 1, wherein the gate and source electrodes comprise said first and second input electrodes, respectively, and said second phase shift imparted to said second input signal differs by an amount of phase from said second phase shift imparted to said first input signal, in which $\theta$ satisfies the following equation;

$$\cos\theta = \frac{1}{2}\left[\frac{1}{k} + k - \sqrt{\left(\frac{1}{k} + k\right)^2 + 4}\right],$$

where k represents a ratio of the amplitude of said second input signal to the amplitude of said first input signal.

7. A phase detector according to claim 1 further comprising a converting circuit being supplied with a third input signal and converting said third input signal into said first and second input signals having therebetween a mutual phase difference which varies in response to deviations in frequency of said third input signal from a predetermined frequency, said first and second input signals being supplied to said first and second input terminals, respectively, so that said output signal represents the deviations in frequency of said third input signal from said predetermined frequency.

8. A phase detector according to claim 7, wherein said converting circuit includes a resonator having a resonant frequency substantially equal to said predetermined frequency.

* * * * *